(12) United States Patent
Lemieux et al.

(10) Patent No.: US 10,860,752 B2
(45) Date of Patent: Dec. 8, 2020

(54) METHOD AND SYSTEM FOR VISION MEASURE FOR DIGITAL HUMAN MODELS

(71) Applicant: Dassault Systèmes Americas Corp., Waltham, MA (US)

(72) Inventors: Pierre-Olivier Lemieux, Montreal (CA); Matthieu Cauffiez, Montreal (CA); Arnaud Barré, Montreal (CA); Nicola Hagemeister, Montreal (CA); Rachid Aissaoui, Montreal (CA)

(73) Assignee: Dassault Systémes Americas Corp., Waltham, MA (US)

( * ) Notice: Subject to any disclaimer, the term of this patent is extended or adjusted under 35 U.S.C. 154(b) by 364 days.

(21) Appl. No.: 14/834,612

(22) Filed: Aug. 25, 2015

(65) Prior Publication Data

US 2017/0061043 A1 Mar. 2, 2017

(51) Int. Cl.
*G06F 30/20* (2020.01)
*G06T 13/40* (2011.01)
*G06F 17/11* (2006.01)

(52) U.S. Cl.
CPC .............. *G06F 30/20* (2020.01); *G06F 17/11* (2013.01); *G06T 13/40* (2013.01)

(58) Field of Classification Search
CPC ...... G06F 17/5009; G06F 17/11; G06F 30/20; G06T 13/40
See application file for complete search history.

(56) References Cited

U.S. PATENT DOCUMENTS

| | | | |
|---|---|---|---|
| 10,621,384 B2 | 4/2020 | Lemieux | |
| 2003/0100366 A1* | 5/2003 | Nagase | A63F 13/00 463/33 |

(Continued)

FOREIGN PATENT DOCUMENTS

| | | |
|---|---|---|
| JP | H10240791 | 9/1998 |
| JP | 2014100773 | 6/2014 |

OTHER PUBLICATIONS

Marler, Timothy, et al. Vision performance measures for optimization-based posture prediction. No. 2006-1-2334. SAE Technical Paper, 2006. (Year: 2006).*

(Continued)

*Primary Examiner* — Omar F Fernandez Rivas
*Assistant Examiner* — Joshua E. Jensen
(74) *Attorney, Agent, or Firm* — Hamilton, Brook, Smith & Reynolds, P.C.

(57) ABSTRACT

The present disclosure is directed to a method and corresponding system that improves accuracy of a computer simulation of an original posture of a digital human model (DHM) relative to a target object. The method and system may obtain information associated with the original DHM posture. The obtained DHM posture information may include a position of a head of the DHM. The method and system may obtain information associated with the target object. The obtained target object information may include a size of the target object and an orientation of the target object. The method and system method may obtain a distance from the head of the DHM to the target object. In some embodiments, the system and method may generate a measure of vision (i.e., vision measure) of the DHM of the target object that the DHM is visually targeting. The system and method may generate the measure of vision based on one or more parameters which may include any of the obtained DHM posture information, the obtained target object information, and the obtained head-target (HT) distance. Based on the measure of vision, the system and method may generate a constraint of vision (i.e., vision constraint) of the DHM to the target object. Based on the vision constraint, the system and method may generate an updated DHM posture.

20 Claims, 6 Drawing Sheets

(56) References Cited

U.S. PATENT DOCUMENTS

| | | |
|---|---|---|
| 2004/0263518 A1 | 12/2004 | Anderson |
| 2006/0061574 A1 | 3/2006 | Ng-Thow-Hing et al. |
| 2010/0030532 A1 | 2/2010 | Arora et al. |
| 2011/0298800 A1* | 12/2011 | Schlichte ............... G06T 15/04 345/420 |
| 2013/0079928 A1 | 3/2013 | Soe-Knudsen et al. |
| 2013/0230838 A1 | 9/2013 | Iannotti et al. |
| 2014/0287389 A1 | 9/2014 | Kallmann et al. |
| 2017/0169138 A1 | 6/2017 | Lemieux et al. |

OTHER PUBLICATIONS

Zhou, Wei, et al. Simulating complex automotive assembly tasks using the HUMOSIM framework. No. 2009-1-2279. SAE Technical Paper, 2009. (Year: 2009).*

Masih-Tehrani, Behdad, and Farrokh Janabi-Sharifi. "Kinematic modeling and analysis of the human workspace for visual perceptibility." International Journal of Industrial Ergonomics 38.1 (2008): 73-89. (Year: 2008).*

Kim, K. Han, et al. The role of visual and manual demand in movement and posture organization. No. 2006-1-2331. SAE Technical Paper, 2006. Abstract only (Year: 2006).*

Bailey, Ian L., and Jan E. Lovie. "New Design Principles for Visual Acuity Letter Charts*." Optometry and Vision Science 53.11 (1976): 740-745. (Year: 1976).*

Yang, Jingzhou, et al. "Validation of Predicted Posture for the Virtual Human Santos TM." Digital Human Modeling (2007): 500-510. (Year: 2007).*

Xiang, Yujiang, et al. "Human lifting simulation using a multi-objective optimization approach." Multibody System Dynamics 23.4 (2010): 431-451. (Year: 2010).*

Hue, Valentin, J-Y. Fourquet, and Pascale Chiron. "On realistic human motion simulation for virtual manipulation tasks." 2008 10th International Conference on Control, Automation, Robotics and Vision. IEEE, 2008. (Year: 2008).*

Yang, Jingzhou James, Tim Marler, and Salam Rahmatalla. "Multi-objective optimization-based method for kinematic posture prediction: development and validation." Robotica 29.2 (2011): 245-253. (Year: 2011).*

De Groot, J.H., and Brand, R., "A three-dimensional regression model of the shoulder rhythm," Clin Biomech (Bristol, Avon), Nov. 2001. 16(9): p. 735-743.

Grewal, T.-J. and Dickerson, C.R., "A novel three-dimensional shoulder rhythm definition that includes overhead and axially rotated humeral postures," Journal of Biomechanics, Feb. 2013, 46(3): p. 608-611.

Inman, V.T., Saunders, J.B., and Abbott, L.C., "Observations on the Function of the Shoulder Joint," Clin Orthop Relat Res, Jan. 1944, 26(1): p. 1-30.

Ludewig, P.M., et al., "Motion of the Shoulder Complex During Multiplanar Humeral Elevation," J Bone Joint Surg Am, Feb. 2009, 91(2): p. 378-389.

McClure, P.W., et al., "Direct 3-dimensional measurement of scapular kinematics during dynamic movements in vivo," J Shoulder Elbow Surg, May/Jun. 2001, 10(3): p. 269-277.

Wang, X., et al., "Three-dimensional modelling of the motion range of axial rotation of the upper arm," J Biomech, Jun. 1998, 31(10): p. 899-908.

Delfs, N., "Manikin in Time; Development of the Virtual Manikin with External Root and Improved Inverse Kinematics," in Mathematical Sciences, May 2012, University of Gothenburg: Gothenburg. p. 40.

Christiensen, J.M. and J.W. McBarron, Man-Systems Integration Standards (NASA-STD-3000), N.A.a.S. Administration, Editor. 1989, National Aeronautics and Space Administration: Houston, TX, USA.

Engin, A.E. and Chen, S.-M., "Statistical Data Base for the Biomechanical Properties of the Human Shoulder Complex—I: Kinematics of the Shoulder Complex," J Biomech Eng, Aug. 1986, 108(3): p. 215-221.

Turner, S.T. and Engin, A.E., "Three-Dimensional Kinematic Modelling of the Human Shoulder Complex—Part II: Mathematical Modelling and Solution via Optimization," J Biomech Eng, May 1989. 111(2): p. 113-121.

Gehrmann, S.V., Kaufmann, R.A., and Li, Z.M., "Wrist Circumduction Reduced by Finger Constraints," J Hand Surg Am, Apr. 2008. 33(8): p. 1287-1292.

Bailey, I.L. and Lovie, J.E., "New Design Principles for Visual Acuity Letter Charts," American Journal of Optometry & Physiological Optics, 53(11): p. 740-745, Nov. 1976.

Duffy, V.G., "Introduction, in Handbook of Digital Human Modeling: Research for Applied Ergonomics and Human Factors Engineering," V.G. Duffy, Editor 2008, CRC Press, Inc.: Boca Raton, Florida, p. 1-8 (table of contents included only), Nov. 2008.

Marler, T., Farrell, K., Kim, J., Rahmatalla, S., Abdel-Malek, K., "Vision Performance Measures for Optimization-Based Posture Prediction," in Digital Human Modeling for Design and Engineering Conference 2006, SAE International: Lyon, France, p. 1-12, Jul. 2006, technical paper No. 2006-01-2334.

Notification of and Extended European Search Report issued in European Patent Application 16182472.7, "Method and System for Vision Measure for Digital Human Models," dated Jan. 9, 2017.

Zhou, et al., "Simulating Complex Automotive Assembly Tasks Using the HUMOSIM Framework," Jun. 9, 2009, 14 pages, ISSN 0148-7191, DOI 10.4271/2009-01-2279 Retrieved from the Internet: citeseerx.ist.psu.edu/viewdoc/download?doi=10.1.1.458.5238&rep=rep1&type=pdf [retrieved on Jan. 9, 2017].

Notification of and Extended European Search Report issued in European Patent Application 16203060.5, "Method and System of Constraint-Based Optimization of Digital Human Upper Limb Models," dated Apr. 28, 2017.

Charbonnier, et al., "A patient-specific measurement technique to model shoulder joint kinematics," Orthopaedics & Traumatology: Surgery & Research, vol. 100, No. 7, Nov. 1, 2014, pp. 715-719.

Wilhelms, et al., "Fast and Easy Reach-Cone Joint Limits," Aug. 2, 2001, 10 pages, XP055365812, Retrieved from the Internet: https://pdfs.semanticscholar.org/d535/e562effd08694821ea6a8a5769fe10ffb5b6.pdf [retrieved on Apr. 20, 2017].

Christiensen, J.M. and J.W. McBarron, Man—Systems Integration Standards (NASA-STD-3000), N.A.A.S. Administration, Editor. 1989 National Aeronautics and Space Administration: Houston, TX, USA. (vol. I, 617 pages).

Masih-Tehrani, Behdad, and Farrokh Janabi-Sharifi, "Kinermatic Modeling and Analysis of the Human Workspace for Visual Perceptibility," International Journal of Industrial Ergonomics 38.1 (2008), pp. 73-89, available online Nov. 28, 2007.

Kim, K. Han, et al., "The Role of Visual and Manual Demand in Movement and Posture Organization," No. 2006-01-2331, SAE Technical Paper, Published Jul. 4, 2006, Abstract only.

Yang, Jingzhou, et al., "Validation of Predicted Posture for the Virtual Human Santos TM," First International Conference on Digital Human Modeling, Jul. 22, 2007, pp. 500-510.

Maurel, et al., "Human Shoulder Modeling Including Scapula-Thoracic Constraint and Joint Sinus Cones," Computer and Graphics vol. 24 (2000) 203-218, Apr. 2000.

Levasseur, et al., "The Effect of Axis Alignment on Shoulder Joint Kinematics Analysis During Arm Abduction," Clinical Biomechanics vol. 22, No. 7 (2007) 758-766, Aug. 2007.

Edelsbrunner, H., Kirkpatrick, D., and Seidel, R., "On the Shape of a Set of Points in the Plane," Information Theory, IEEE Transactions on, Jul. 1983. 29(4): p. 551-559.

Engin, A.E. and Chen, S.-M., "Statistical Data Base for the Biomechanical Properties of the Human Shoulder Complex—II: Passive Resistive Properties Beyond the Shoulder Complex Sinus," J Biomech Eng, Aug. 1986. 108(3): p. 222-227.

Maurel, W., "3D Modeling of the Human Upper Limb Including the Biomechanics of Joints, Muscles and Soft Tissues," in Informatique, Jan. 1999, École Polytechnique Fédérale de Lausanne (EPFL): Lausanne, Suisse. p. 204.

(56) References Cited

OTHER PUBLICATIONS

Veeger, H.E.J. and Yu, B., "Orientation of axes in the elbow and forearm for biomechanical modeling," in Biomedical Engineering Conference, Mar. 1996, Proceedings of the 1996 Fifteenth Southern, Mar. 1996.

Wilhelms, J. and A. Van Gelder, Fast and easy reach-cone joint limits. J. Graph. Tools, 2002. 6(2): p. 27-41.

Doody, S.G., L. Freedman, and J.C. Waterland, Shoulder movements during abduction in the scapular plane. Arch Phys Med Rehabil, 1970. 51(10): p. 595-604.

Poppen, N.K. and P.S. Walker, Normal and abnormal motion of the shoulder. J Bone Joint Surg Am, 1976. 58(2): p. 195-201.

Bagg, S.D. and W.J. Forrest, *A biomechanical analysis of scapular rotation during arm abduction in the scapular plane.* Am J Phys Med Rehabil, 1988. 67(6): p. 238-245.

Johnson, G.R., P.R. Stuart, and S. Mitchell, *A method for the measurement of three-dimensional scapular movement.* Clin Biomech (Bristol, Avon), 1993. 8(5): p. 269-273.

McQuade, K.J. and G.L. Smidt, *Dynamic scapulohumeral rhythm: the effects of external resistance during elevation of the arm in the scapular plane.* J Orthop Sports Phys Ther, 1998. 27(2): p. 125-133.

Van der Helm, F.C. and G.M. Pronk, *Three-dimensional recording and description of motions of the shoulder mechanism.* J Biomech Eng, 1995. 117(1): p. 27-40.

Ludewig, P.M., T.M. Cook, and D.A. Nawoczenski, *Three-dimensional scapular orientation and muscle activity at selected positions of humeral elevation.* J Orthop Sports Phys Ther, 1996. 24(2): p. 57-65.

Meskers, C.G.M., et al., *3D shoulder position measurements using a six-degree-of-freedom electromagnetic tracking device.* Clinical Biomechanics, 1998. 13(4-5): p. 280-292.

Diffrient, N., A. Tilley, and D. Harman, Humanscale 1/2/3. 1981, Massachusetts Institute of Technology: Cambridge, MA (4 pages), Abstract only.

Diffrient, N., A. Tilley, and D. Harman, Humanscale 4/5/6. 1981, Massachusetts Institute of Technology: Cambridge, MA (4 pages), Abstract only.

Diffrient, N., A. Tilley, and D. Harman, Humanscale 7/8/9. 1981, Massachusetts Institute of Technology: Cambridge, MA (3 pages), Abstract only.

Cortes, et al, "Upper Limb Posture Estimation in Robotic and Virtual Reality-Based Rehabilitation", Hindawi Publishing Corporation BioMed Research International, vol. 2014, Article ID 821908, 18 pages, Jul. 2014.

Hagemeister, et al., "Effect of axis alignment on in vivo shoulder kinematics", Computer Methods in Biomechanics and Biomedical Engineering, 14(8):755-761, Feb. 2011.

Lemieux, et al., "Degrees of freedom coupling adapted to the upper limb of a digital human model", International Journal of Human Factors Modelling and Simulation, 5(4):1-8, Jan. 2017.

Lemieux, et al., "Influence of the medial offset of the proximal humerus on the glenohumeral destabilising forces during arm elevation: a numerical sensitivity study", Computer Methods in Biomechanics and Biomedical Engineering, 16(1):103-111, Feb. 2012.

Lemieux et al., "Mechanical analysis of cuff tear arthropathy during multiplanar elevation with the AnyBody shoulder model", Clinical Biomechanics, 27(2012):801-806, Apr. 2012.

Ludewig et al., "Three-Dimensional Clavicular Motion During Arm Elevation: Reliability and Descriptive Data", Journal of Orthopaedic & Sports Physical Therapy, 34(3):140-149, Mar. 2004.

Schenkman, M., "Kinesiology of the Shoulder Complex",1987 Journal of Orthopaedic & Sports Physical Therapy (Year: 1987).

Prinold, Joe A.I. et al., "Scaling and kinematics optimisation of the scapula and thorax in upper limb musculoskeletal models", Journal of Biomechanics, 47(11):2813-2819 (May 27, 2014).

Zhibin, S., et al., "A New Skeleton Model and the Motion Rhythm Analysis for Human Shoulder Complex Oriented to Rehabilitation Robotics." Applied bionics and biomechanics 2018 (2018). (Year: 2018).

Song, Z., "A New Skeleton Model and the Motion Rhythm Analysis for Human Shoulder Complex Oriented to Rehabilitation Robotics." Applied bionics and biomechanics 2018 (2018).

\* cited by examiner

METHOD AND SYSTEM FOR VISION MEASURE FOR DIGITAL HUMAN MODELS

BACKGROUND OF THE INVENTION

Digital human models (DHMs), such as manikins, may offer virtual representations of the human skeletal system, proposed as an assembly of simple segmental links in various kinematic chains (upper limbs, lower limbs, spine). See for example, the following publication which is hereby incorporated by reference in its entirety herein: Duffy, V. G., "Introduction, in Handbook of Digital Human Modeling: Research for Applied Ergonomics and Human Factors Engineering," V. G. Duffy, Editor 2008, CRC Press, Inc.: Boca Raton, Fla., November, 2008. Such tools can be used to predict human postures adopted during various simulated tasks in order to evaluate the risk of injury and to properly size the environment around humans of different anthropometries. The postures may be generated with an inverse kinematics (IK) engine that determines the degrees of freedom (DOF) of the manikin corresponding to specified end-effector (e.g., hands, head, and feet) position and/or orientations.

SUMMARY OF THE INVENTION

However, in existing DHM approaches, human tasks may involve variable degrees of vision requirements that can influence the posture. Existing digital human models (DHM) may have proposed constraints based on vision (see for example, the following publication which is hereby incorporated by reference in its entirety herein: Marler, T., Farrell, K., and Kim, J., Rahmatalla, S., Abdel-Malek, K., "Vision Performance Measures for Optimization-Based Posture Prediction," in Digital Human Modeling for Design and Engineering Conference 2006, SAE International: Lyon, France, p. 12, July, 2006, technical paper no. 2006-01-2334, but fail to account for the aspects of (1) target size, (2) target orientation and (3) level of precision/focus of the task (i.e., high precision vs. low precision). As such, some embodiments may include a novel vision constraint that may simultaneously account for these three aspects, in order to improve accuracy of a computer simulation of an original posture of a DHM.

Thus, the present disclosure is directed to a method and corresponding system that improves accuracy of a computer simulation of an original posture of a digital human model (DHM), which may include but is not limited to being a manikin, relative to a target object (also known herein as object, target, virtual target, or visual target). In some embodiments, the system and method may obtain information associated with the original DHM posture. The obtained DHM posture information may include a position of a head of the DHM. In some embodiments, the system and method may obtain information associated with the target object. The obtained target object information may include a size of the target object and an orientation of the target object. According to some embodiments, the obtained target object information may include a size of the target object and an orientation of the target object in a predefined plane. In some embodiments, the system and method may obtain a distance from the head of the DHM to the target object. In some embodiments, the system and method may generate for the DHM a measure of vision (i.e., vision measure) of the target object that the DHM is visually targeting. The system and method may generate the measure of vision based on one or more parameters which may include any of the obtained DHM posture information, the obtained target object information, and the obtained head-target (HT) distance. Based on the measure of vision, the system and method may generate a constraint of vision (i.e., vision constraint) of the DHM to the target object. Based on the vision constraint, the system and method may generate an updated DHM posture.

In some embodiments, the object may take on various shapes. In some embodiments, the size of the target object may include a size of a facet of the target object. In some embodiments, a facet may be defined as a portion of the target object. In some embodiments, a target object may be represented as a mesh, which may be built from a plurality of triangularly shaped facets. In some embodiments, for a three-dimensional target object which is a sphere, a set of facets may be used to represent a portion of the sphere, which may be used to represent a portion of the target object, but which has at least one triangular shape on one or more of the sides of the three-dimensional target object. In some embodiments, the target object may be three-dimensional. In some embodiments, the target object may be two-dimensional.

In some embodiments, the orientation of the target object may include an orientation of a facet of the target object. In some embodiments, the one or more parameters may include an angle between a normal to a facet of the target object and a vector representation. In some embodiments, the one or more parameters may include an angle between a normal to a surface of a facet of the target object and a vector representation. The vector representation may have a magnitude of the obtained HT distance between the manikin head and the target object (or head-target HT distance) and a direction from the head of the DHM to the target object.

In some embodiments, the system and method may further generate the vision constraint based on a precision level that represents a level of precision required for the DHM to perform a task associated with the target object. In some embodiments, the vision constraint may represent a measure of closeness of the DHM to the target object and/or an ability of the DHM to perform a task associated with the target object. In some embodiments, the system and method may generate the updated DHM posture based on the measure of closeness of the DHM to the target object and/or the ability of the DHM to perform the task associated with the target object.

In some embodiments, the vision constraint may be generated based on a logarithm of the measure of vision. In some embodiments, the updated DHM posture may provide an increased ability of the DHM to perform a task associated with the target object as compared with an ability of the DHM to perform the task associated with the target object using the original DHM posture.

In some embodiments, the system and method may further generate a three-dimensional visual space that provides an indication of an ability of the DHM to perform a task associated with the target object. In some embodiments, the system and method may further generate the updated DHM posture based on any of an inverse kinematics engine, the vision constraint, and degrees of freedom of the DHM. In some embodiments, the inverse kinematic engine may receive the vision constraint and determine the degrees of freedom of the DHM. In some embodiments, the obtained HT distance may be obtained based on measurement of the head of the DHM and the target object from reflective markers. In other words, the obtained HT distance may be obtained based on measurement of the head of the DHM and the target object, and the DHM measurement and/or the target object measurement may be obtained from reflective markers. As known to those skilled in the art, the reflective markers may be located at the target object and/or at any location where the reflective marker may reflect to the target object and/or DHM head.

In some embodiments, the system and method may utilize an inverse kinematic engine, a data engine, a processing engine, a posturing engine, or any combination thereof, in order to achieve the above-mentioned features.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of exemplary embodiments of the invention follows.

The teachings of all patents, published applications and references cited herein are incorporated by reference in their entirety.

Human tasks involve variable degrees of vision requirements that can influence the posture. Existing digital human models (DHM) may have proposed constraints based on vision (see for example, the following publication which is hereby incorporated by reference in its entirety herein: Marler, T., Farrell, K., and Kim, J., Rahmatalla, S., Abdel-Malek, K., "Vision Performance Measures for Optimization-Based Posture Prediction," in Digital Human Modeling for Design and Engineering Conference 2006, SAE International: Lyon, France, p. 12, July, 2006, technical paper no. 2006-01-2334, hereinafter "Marler, et al."), but fail to account for one or more of three important aspects: (1) target size, (2) target orientation and (3) level of precision/focus of the task (e.g., high vs. low). Some embodiments include a novel vision constraint that simultaneously accounts for these three aspects.

According to some embodiments, in order to be realistic, the posture predicted by the DHM honors a series of physiological requirements, including one related to vision (see for example, Marler, et al., referenced above). As a general rule, humans tend to look at the target when they perform a task that requires a certain amount of focus (see, for example, Marler, et al.). Moreover, some tasks such as carefully inserting a small pin in a small hole may require much more precision and visual acuity than other simpler tasks (e.g., pushing a large button). In these cases, simply looking at the target by adjusting head orientation may not guarantee the realism of the predicted whole body posture, as other aspects such as object dimensions (e.g., facets size and/or orientation) and the precision level related to the task may become predominant factors that are likely to affect head-target distance.

Visual information may be derived from different measures. For example, human visual acuity may be related to the "sight angle," i.e., the deviation angle between the "head-target" (HT) and "Line-of-Sight" (LOS) vectors (see for example, Marler, et al.). Visual acuity may be maximal when the sight angle is null (i.e., subject LOS is directly pointing at the target) and may decrease non-linearly as the sight angle increases (see, for example, Marler, et al.). Such measure has already been used to drive the posture of a virtual manikin (see, for example, Marler, et al.). Another example of visual acuity is the "Log MAR," which is the logarithm in base 10 (i.e., $Log_{10}$) of the minimum angle resolution (MAR), i.e., the angle subtended by a character stroke width (see for example, the following publication which is hereby incorporated by reference in its entirety herein: Bailey, I. L. and Lovie, J. E., "New Design Principles for Visual Acuity Letter Charts," American Journal of Optometry & Physiological Optics, 53(11): p. 740-5, November, 1976, hereinafter "Bailey, et al."). This visual acuity score may be computed in minutes of arc and may be based on a predefined HT distance (e.g., 6 m) and orientation (i.e., stand normal to a chart). A subject with a perfect vision can read all the letters on the same line with a stroke width subtending 0.5 minutes of arc and is given a Log MAR of 0. Meanwhile, a Log MAR greater than 1.0 indicates that the subject has poor vision, since he may not read letters on the same line with a stroke width subtending 10 minutes of arc, which are considered as big letters.

Neither the sight angle of Marler, et al. nor the Log MAR of Bailey, et al. allow engineers to account for various object sizes (e.g., small vs. big), object facet orientation (different than HT vector orientation) and various task precision levels (e.g., high vs. low). In order to account for these aspects, according to some embodiments, the HT distance and orientation may be adapted for situations where the target object is small, when the task of the DHM requires a high precision/focus (e.g., carefully inserting a small pin in a small hole), and/or when the target object may be outside of the field of vision of the DHM. Limitations of the existing approach of Log MAR is that its range (−0.3 to 1.0) is measured with predefined object sizes (i.e. letter stroke width), predefined HT distance (e.g., 6 m) and predefined orientation (LOS normal to chart). Meanwhile, the existing Log MAR sight angle computation does not take into account the HT distance. However, embodiments of the present invention remedy these above-mentioned deficiencies.

Figure 1:
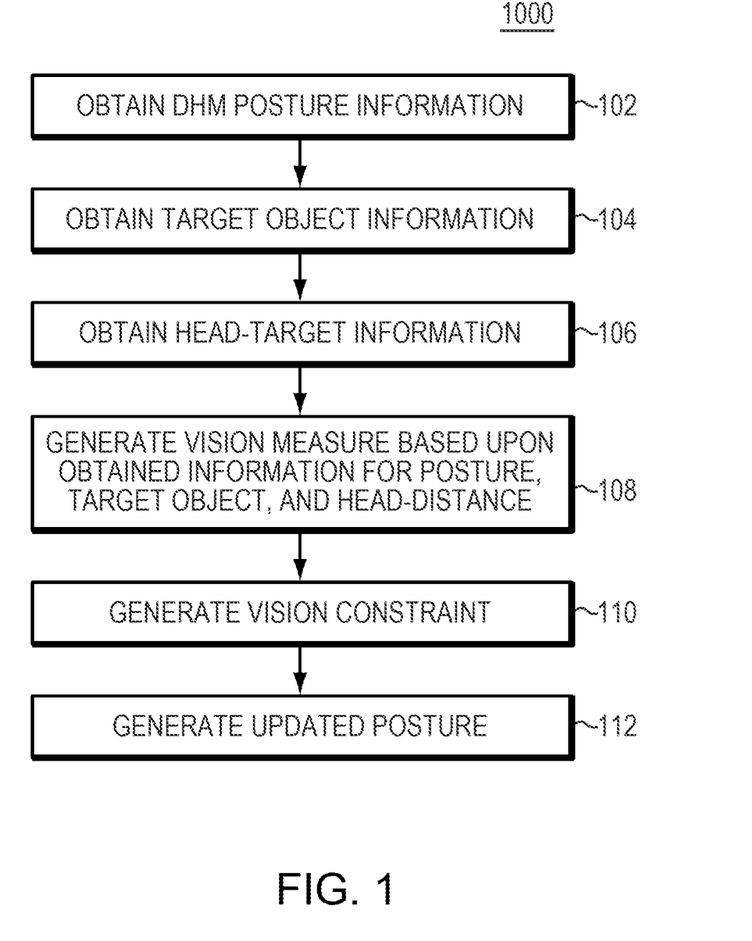
FIG. 1 illustrates a high-level flowchart of steps of the present invention according to some embodiments.

FIG. 1 illustrates a high-level flowchart of steps of a method 1000 that improves accuracy of a computer simulation of an original posture of a digital human model (DHM) relative to a target object, according to some embodiments. Note, in some embodiments, the steps of the method 1000 may be configured as one or more components of a computer system. According to some embodiments, each step of FIG. 1 may be performed on a per-facet basis, i.e., for a given facet of a target object, or for all facets of a target object.

A facet of the target object is defined herein to include any aspect of the target object, according to some embodiments.

In some embodiments, a facet may comprise a surface of a plane and/or a line associated with the target object. In some embodiments, a facet may comprise a flat face of the target object, where the target object has a geometric shape and has a plurality of facets. Further, in some embodiments, a facet may be defined as a portion of a target object. In some embodiments, a target object may be comprised of a plurality of facets. In some embodiments, a target object may take on various shapes. In some embodiments, a target object may have one or more facets and/or sides which are triangularly shaped. In some embodiments, the target object may be three-dimensional (3D). In some embodiments, for a 3D target object which is a sphere, a set of facets may be used to represent a portion of the sphere, which may be used to represent a portion of the 3D target object, but which has at least one triangular shape on one or more of the sides of the 3D target object. In some embodiments, for a target object which is a sphere, a facet may be a portion of the sphere which includes a portion of the spherical surface of the target object, but which has at least one triangular shape on one or more of the sides of the three-dimensional facet. In some embodiments, the target object may be two-dimensional, e.g., a projection of the 3D target object in a plane.

In step 102, DHM posture information is obtained. In step 104, target object information is obtained. In step 106, head-target (HT) information (information regarding the distance between the head of the DHM and the target object) is obtained. In step 108, a vision measure is generated based on the sets of obtained information of the DHM posture, the target object, and the head-target distance of steps 102, 104, and 106. In step 110, a vision constraint is generated based on the vision measure of step 108. In step 112, an updated posture is generated based on the resulting vision constraint of step 110.

In other words, in some embodiments, the method 1000 obtains information associated with the original DHM posture 102. The obtained DHM posture information may include a position of a head of the DHM. In some embodiments, the method 1000 obtains information associated with the target object 104. The obtained target object information may include a size of the target object (i.e., the first above-mentioned aspect, or target size, also known as distance "b" to follow) and an orientation of the target object (i.e., the second above-mentioned aspect, or target orientation, also known as vector "Ŝ" to follow). In some embodiments, the method 1000 obtains a distance from the head of the DHM to the target object 106 (i.e., HT distance). In some embodiments, the method 1000 generates a measure of vision (i.e., vision measure) of the DHM of the target object that the DHM is visually targeting 108. The method 1000 generates the measure of vision based on one or more parameters which may include any of the obtained DHM posture information, the obtained target object information, and the obtained head-target (HT) distance. Based on the measure of vision 108, the method 1000 generates a constraint of vision (i.e., vision constraint) of the DHM to the target object 110. Based on the vision constraint 110, the method 1000 generates an updated DHM posture 112.

In some embodiments, the size of the target object may include a size of a facet of the target object. In some embodiments, the orientation of the target object may include an orientation of the facet of the target object. In some embodiments, the one or more parameters may include an angle between a normal to a surface of a facet of the target object and a vector representation. In some embodiments, the one or more parameters may include an angle between a normal to a facet of the target object and a vector representation. The vector representation may have a magnitude of the obtained head-target (HT) distance and a direction from the head of the DHM to the target object. In some embodiments, the orientation of the target object may include a normal vector which may be normal to a facet of the target object.

In some embodiments, the method 1000 further generates the vision constraint 110 based on a precision level (the third above-mentioned aspect, also known as "PL") that represents a level of precision required for the DHM to perform a task associated with the target object. In some embodiments, the vision constraint may represent at least one of a measure of closeness of the DHM to the target object and an ability of the DHM to perform a task associated with the target object. In some embodiments, the method 1000 generates the updated DHM posture 112 based on at least one of the measure of closeness of the DHM to the target object and the ability of the DHM to perform the task associated with the target object.

In some embodiments, the vision constraint 110 may be generated 110 based on a logarithm of the measure of vision. In some embodiments, the updated DHM posture may provide an increased ability of the DHM to perform a task associated with the target object as compared with an ability of the DHM to perform the task associated with the target object using the original DHM posture.

In some embodiments, the method 1000 further generates 112 a three-dimensional visual space that provides an indication of an ability of the DHM to perform a task associated with the target object. In some embodiments, the method 1000 further generates 112 the updated DHM posture based on any of an inverse kinematics engine, the vision constraint, and degrees of freedom of the DHM. In some embodiments, the inverse kinematic engine may receive the vision constraint and determine the degrees of freedom of the DHM. In some embodiments, the obtained head-target (HT) distance may be obtained based on measurement of the head of the DHM and/or the target object from reflective markers.

According to some embodiments, the vision constraint may be a part of the smart posturing engine, which relies on a non-linear optimization-based IK engine. Some embodiments solve the following optimization problem:

$$\min_x f(x) \text{ such as } c(x) \leq 0 \qquad \text{Equation 1:}$$

$$c(x) = PL - \text{Log } VA(x) \qquad \text{Equation 2:}$$

where, in Equation 1, f(x) is the problem to minimize (i.e., optimization problem), 'x' may include the manikin's degrees of freedom (DOF), and where, in Equation 2, c(x) may represent the vision constraint, including the desired precision level (PL). According to some embodiments, Log VA(x) of Equation 2 may be considered to be Log VA (without an 'x' component) or Log(VA). The 'x' component may include DHM head (H) information.

According to some embodiments, this vision constraint (Log VA(x) or Log VA) may be used to predict the head-target (HT) distance of a DHM, using two precision levels (PL) obtained experimentally (high and low precision levels, respectively). In existing approaches, visual acuity may be measured with the $\text{Log}_{10}$ of the minimum angle resolution (MAR), i.e., the angle subtended by a character stroke width (see for example, Bailey, et al.), also known as the "Log MAR." The "Log MAR" is based on a fixed and/or pre-defined HT distance (i.e., 6 m) and orientation (LOS normal to chart).

Figure 3:
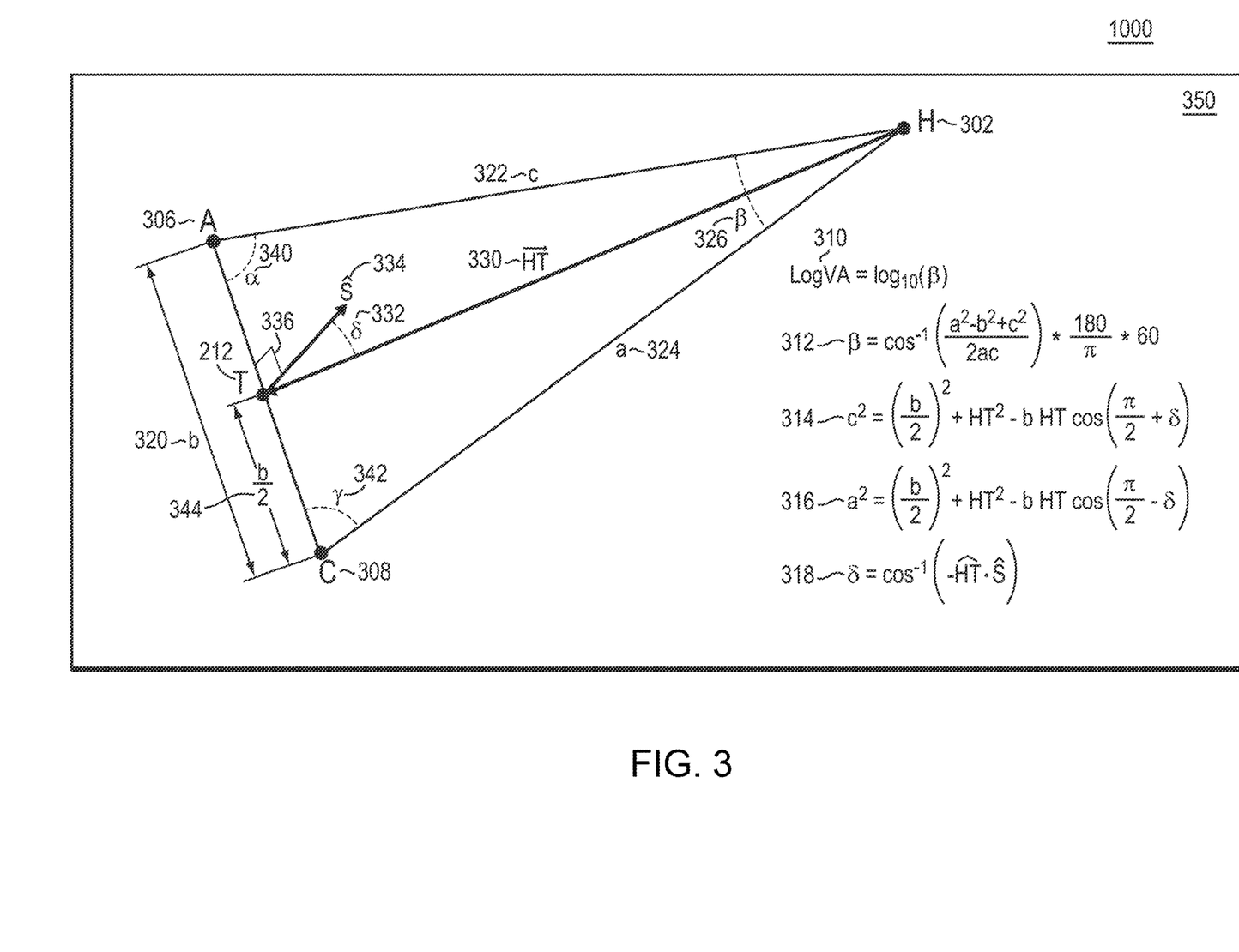
FIG. 3 illustrates a calculation of vision measure according to some embodiments.

Some embodiments include a vision measure named "Log VA" ($\text{Log}_{10}$ of Visual Angle), which may extend the Log MAR for a target of size $b=\overline{AC}$, whose facet normal ($\hat{S}$) may form an angle $\delta \neq 0$ with the HT vector ($\overrightarrow{HT}$) as illustrated in FIG. 3. In some embodiments, the Log VA may be implemented using a nonlinear solver with the above-mentioned optimization problem of Equations 1 and 2.

The vision non-linear constraint c(x) is the difference between the desired precision level (PL) of the task and the actual value of the Log VA. A vision constraint higher than 0 means that the DHM's head is too far from the target to clearly see it and properly fulfill the task (i.e., outside of the visual space 410 illustrated in FIG. 4 to follow). According to some embodiments, a vision constraint lower or equal to 0 indicates that the head is located at an acceptable distance (or closer) from the target object to fulfill the task (i.e., on the surface of and/or inside of the visual space 410). In other words, according to some embodiments, a vision constraint lower or equal to 0 indicates that the head is located close enough to the target object to fulfill the task.

Figure 2:
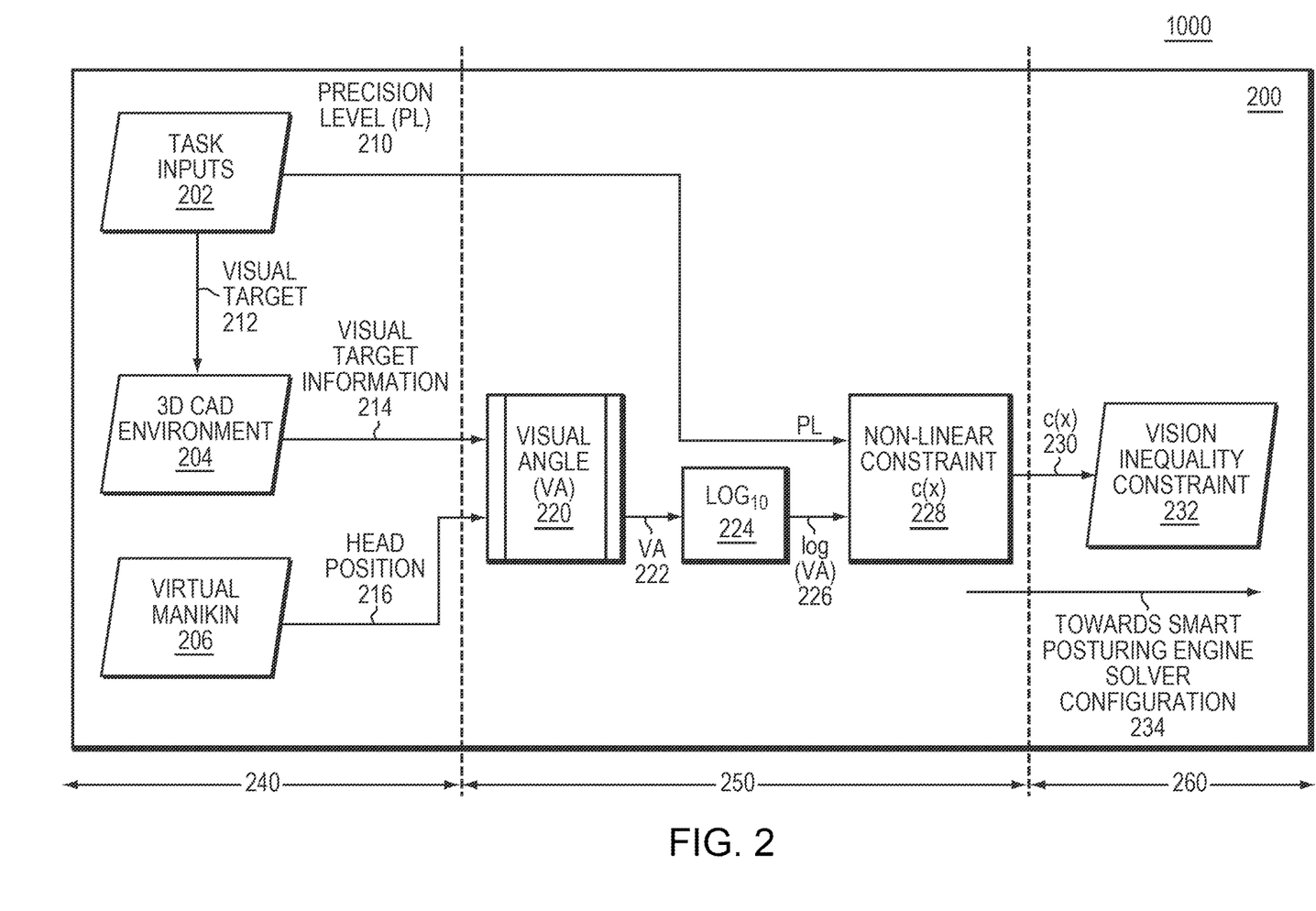
FIG. 2 illustrates a flow diagram including inputs and outputs according to some embodiments.

FIG. 2 illustrates a flow diagram of method 1000, including inputs and outputs according to some embodiments. As also illustrated in the flow diagram of FIG. 2, a vision constraint 230 may be embedded within a smart posturing engine 200. As further illustrated in FIG. 2, some embodiments may include a method 1000 that improves accuracy of a computer simulation of an original posture of a digital human model (DHM), or virtual manikin 206, relative to a target object (or visual target) 212.

As illustrated in FIG. 2, some embodiments of engine 200 receive input information 240 (including but not limited to elements 202, 204, and 206). Input information 240 may include one or more task inputs 202 with corresponding precision levels (PL) 210 and visual targets (212), one or more three-dimensional computer-aided design (3D CAD) environments 204 with visual target information 214, and one or more virtual manikins 206 with corresponding head position information 216 with respect to the degrees of freedom (DOF).

As illustrated in FIG. 2, some embodiments of engine 200 may include processes 250 (including but not limited to elements 220, 224, and 228). In some embodiments, processes 250 may be predefined. Processes 250 may include a visual angle computation 220 (which outputs a visual angle, VA, 222), a $\text{Log}_{10}$ computation 224 (which outputs a Log (VA) 226), and a non-linear constraint computation 228 (which outputs a vision constraint, c(x), 230). Element 230, c(x), may be output according to Equation 2 above, based on inputs of PL (element 210) and Log(VA) (element 226). As also illustrated in FIG. 2, some embodiments of engine 200 output information 260. The output information 260 may include the constraint c(x) (element 230) into a vision inequality constraint (element 232), which may be sent to a smart posturing engine solver 234, according to some embodiments.

As illustrated in FIGS. 2-3, according to some embodiments, the visual angle (VA) 222 may be obtained using two or more different sources of information, such as visual target information 214 and/or a head position 216. According to some embodiments, a distance between the head 302 (having corresponding head position 216) of the manikin 206 and the target object 212 and/or the head-target (HT) distance, may be calculated within the visual angle computation block 220 based upon the visual target information 214 and/or a head position 216.

As illustrated in FIG. 3, in some embodiments, the size 320 of the target object may include a size 320 of a facet of the target object 212. According to some embodiments, the facet of the target object may be selected by the 3D CAD environment 204 and/or by the visual angle computation block 220. In some embodiments, the orientation of the target object 212 may include the facet normal 334, which indicates the orientation of the selected facet of the target object 212. In some embodiments, the one or more parameters may include an angle 332 between the facet normal 334 of the target object 212 and a vector representation 330. The vector representation 330 may have a magnitude of the obtained HT distance and a direction from the head 302 of the DHM to the target object 212.

As illustrated in FIGS. 2-3, the position 216 of the DHM head 302 may be combined with the visual target information 214 within the visual angle computation block 220 in order to generate the HT vector 330, where the HT vector 330 may include the head position 216 of the virtual manikin 206 with respect to the target object 212. The head position 216 may be controlled by the manikin's root, spine, and/or neck degrees of freedom (DOF).

Referring to FIG. 2, the visual target information 214 may come from the 3D CAD environment 204 that may surround the manikin 206.

As further illustrated in FIGS. 2-3, one or more of the processes 250 (and/or the CAD environment 204) may then generate the perspective view projection 350, which may provide information defining the boundary of the visual target 212 and the direction of its facet normal 334, as it would be perceived by the manikin's 206 eyes. The perspective view projection 350 may include a facet normal 334, which lies in the perspective view projection 350 plane and is normal (i.e., at a 90 degree angle, element 336) to the facet of the target object 212. According to some embodiments, the facet normal 334 may be considered to be a unitary vector that is normal to the facet (i.e., line $b=\overline{AC}$, element 320) and may lie in the perspective view projection 350 plane.

The target object 212 may be simplified with methods such as the convex hull or alpha shape. A series of vectors starting from the point in-between the manikin's 206 eyes toward each node of the simplified shape can be used to estimate a cone subtending one or more planar visual angles. These visual angles 222 may be used to compute the Log VA (element 226) using a logarithm of base 10 ($\text{Log}_{10}$, element 224). Moreover, in order to see the target object 212, the vision constraint c(x) (element 230) also may ensure that the angle 332 between the facet of the target object or line b 320 and the inverted normalized HT vector 330 is inside an interval of ±90°. According to some embodiments, moreover, in order to see the target object 212, part 318 of the vision constraint c(x) (element 230) also may ensure that the angle 332 between the facet of the target object or line b 320 and the inverted normalized HT vector 330 is inside an interval of ±90°.

As illustrated in FIG. 2, the user may provide the precision level (PL) 210 of the task to the solver 234 of the posturing engine 200. According to some embodiments, relevant PL values may be obtained through experiments by computing the HT distance adopted by humans when performing various tasks requiring different levels of precision (i.e., low PL vs. high PL). A visual angle 222 from computation unit 220 may then be easily derived from the object sizes related to the task (e.g., 5 mm computer characters, 1.5 mm breadboard holes) and the average measure of HT distance measured from multiple trials. According to some embodiments the $Log_{10}$ (element 224) of the VA subtended by each PL may replace the PL parameter in Equation 2 above. In some embodiments, the $Log_{10}$ (element 224) of the VA subtended by each PL may replace the PL parameter in Equation 2 above, based on the task performed by the DHM.

The IK solver 234 of the posture engine 200 may use the vision constraint if the user intentionally chooses to use it. In that case, the posturing engine 200 may activate the DHM's 206 head effector (i.e., an end-effector that may be located at the head of the DHM 206 and may manipulate the head of the DHM 206) and the posture engine 200 may then be configured to include the vision constraints 230 in the problem. According to some embodiments, an end-effector may include a device and/or terminal segment of a DHM 206, including but not limited to a DHM's 206 head, hands, and/or feet. According to some embodiments, the end-effector may interact with the virtual environment 204 through the posturing engine 200, which may manipulate, move, and/or re-position the DHM 206 based upon the method 1000 described herein.

Internally, the non-linear solver used by the posture engine 200 includes the constraints at two different levels. First, the non-linear solver verifies if the vision constraint is fulfilled and held (i.e., $c(x)<=0$). Thereafter, the associated constraints gradients (partial derivatives of the constraints regarding the manikin joint DOFs) are used to determine the search direction in the solution space. Eventually, when an optimal solution is found, the posture engine 200 assigns it to the DOF of the manikin. Then, according to some embodiments, the manikin in the resulting final posture is rendered and displayed to the user. By contrast, existing techniques (i.e., sight angle and Log MAR) do not account for variable target object dimensions, and the precision level (PL) of the task, and thus cannot be used to adapt the HT distance so that the target object may be clearly displayed (e.g., seen) and/or so that the task may be completed by the DHM.

Referring to FIG. 1, step 108, according to some embodiments, a vision measure (i.e., measure of vision) is created by the method 1000, also known as the "Log VA" (i.e., $Log_{10}$ of the visual angle), which may be a generalization of the Log MAR that accounts for various target object dimensions (i.e., one or more facet sizes and/or orientations) and various task precision levels. According to some embodiments, the Log VA is calculated in step 108 of FIG. 1, using the following Equations 3.1, 3.2, 3.3, 3.4, and 3.5, which correspond to FIG. 3 elements 310, 312, 314, 316, and 318, respectively. However, embodiments are not so limited, and some embodiments may use other equations to calculate the Log VA.

$$LogVA = \log_{10}(\beta) \quad \text{Equation 3.1 (310)}$$

$$\beta = \cos^{-1}\left(\frac{a^2 - b^2 + c^2}{2ac}\right) * \frac{180}{\pi} * 60 \quad \text{Equation 3.2 (312)}$$

$$c^2 = \left(\frac{b}{2}\right)^2 + HT^2 - b \cdot HT\cos\left(\frac{\Pi}{2} + \delta\right) \quad \text{Equation 3.3 (314)}$$

$$a^2 = \left(\frac{b}{2}\right)^2 + HT^2 - b \cdot HT\cos\left(\frac{\Pi}{2} - \delta\right) \quad \text{Equation 3.4 (316)}$$

$$\delta = \cos^{-1}(-\vec{HT} \cdot \hat{S}) \quad \text{Equation 3.5 (318)}$$

According to some embodiments, the method 1000 employs a perspective view projection 350 to obtain a vision measure 310, as illustrated in FIG. 3. As such, some embodiments may include a vision measure named "Log VA" ($Log_{10}$ of Visual Angle) 310, which may extend the Log MAR for a target object (center of the target being T, element 212) of length (size) $b=\overline{AC}$ (element 320), whose facet normal M, or element 334, may form an angle $\delta \neq 0$ (element 332) with the "head-target" vector ($\vec{HT}$), or element 330.

In other words, FIG. 3 illustrates a vector from the DHM's head, or H (element 302), to the center of the target object T (element 212), also known as the "head-target" vector ($\vec{HT}$), or element 330. A target object (including, but not limited to a given facet of a target object) may have size (length) $b=\overline{AC}$ (element 320), where A (element 306) and C (element 308) may represent endpoints of the size b 320. As illustrated in FIG. 3, lengths c (element 322) and a (element 324) are the distances from H (element 302) to elements A (306) and C (308) respectively. Also illustrated in FIG. 3 are the angle α (element 340) between c (element 322) and b (element 320), and angle γ (element 342) between a (element 324) and b (element 320).

As illustrated in FIG. 3, and Equation 3.1 (element 310), the vision measure 310, or Log VA, may be calculated by taking a $log_{10}$ of β (element 326), or the angle between point A (element 306), point H (element 302), and point C (element 308). As further illustrated in FIG. 3, and Equation 3.2 (element 312), β (element 326) may be calculated based on a (element 324), b (element 320), and c (element 322). As illustrated in Equations 3.3 and 3.4 (elements 314 and 316, respectively), elements c (322) and a (324) may be calculated based on the head-target $\vec{HT}$ (element 330), b (element 320), and angle δ (element 332). As illustrated in Equation 3.5 (element 318), angle δ (element 332) may be determined as the angle between the facet normal vector (Ŝ) (element 334) and the inverted head-target $\vec{HT}$ vector divided by its norm (element 330). The facet normal (Ŝ) (element 334) may be determined to be a normal which is at an angle of 90 degrees (element 336) to b (element 320), the facet normal M (element 334) being located at the center of target object T (element 212). The distance 344 between the center of target object T (element 212) and the endpoint C (element 308) may be equal to half of the distance of $b=\overline{AC}$ (element 320).

Some embodiments may compute the visual angle (i.e., equivalent of the MAR but for one or more various target object facet sizes and/or orientations) and adjust the "head-target" vector so that the $Log_{10}$ of the visual angle corresponds (e.g., may be lower or equal) to a predefined value (precision level, or PL, to follow). The visual angle 222 may be computed from the facet normal 334, which may be normal (e.g., at a 90 degree angle, element 336) to line $b=\overline{AC}$ (element 320) of one selected facet of the target object T (element 212), while also accounting for the orientation of that facet.

Figures 4, 4A, 4B, 4C:
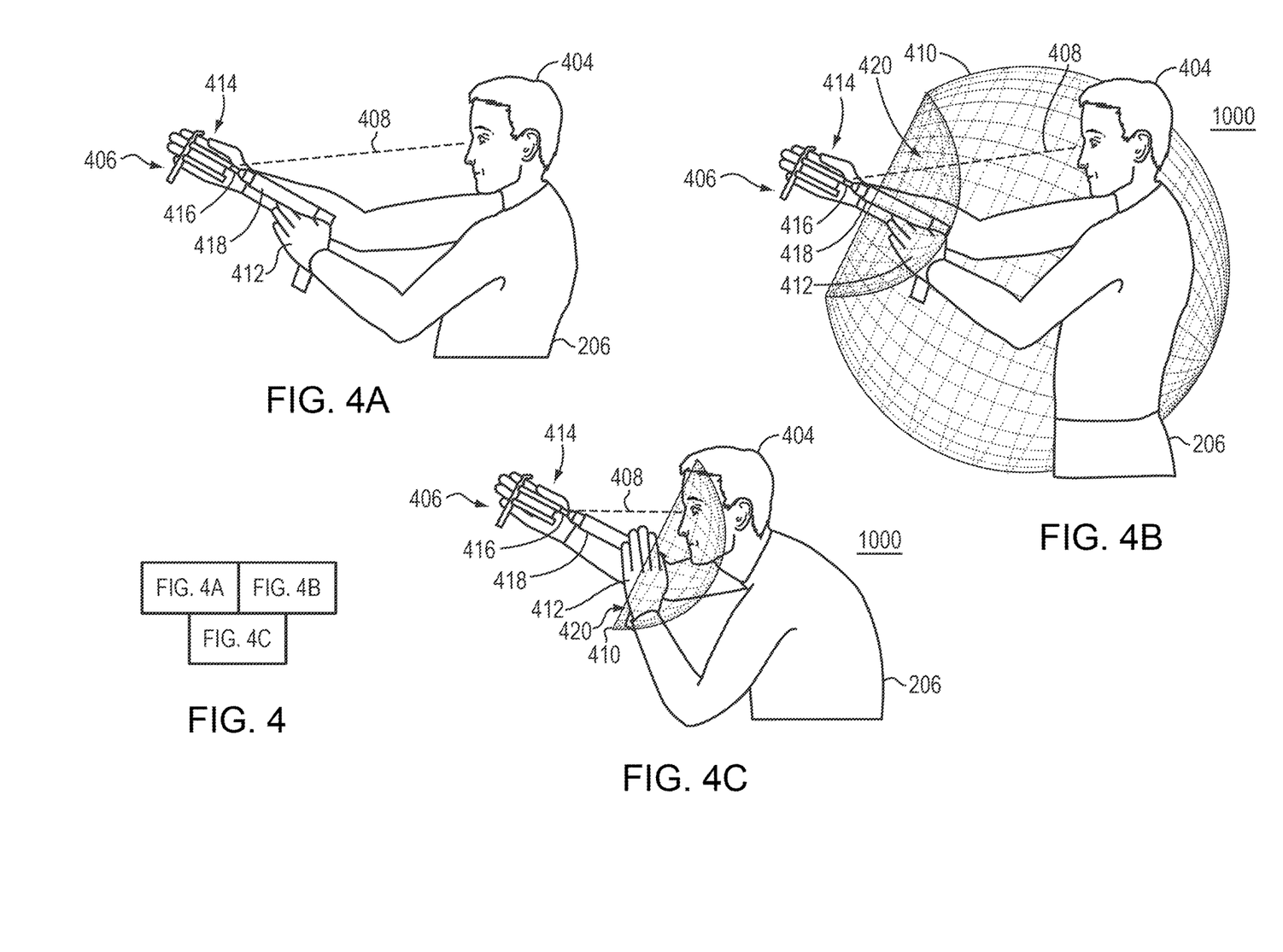
FIG. 4 (FIGS. 4A-C) illustrates comparisons of embodiments with the prior art.
FIG. 4A represents a prior art approach. By contrast to FIG. 4A.
FIG. 4B illustrates an embodiment for a low precision task and FIG. 4C illustrates an embodiment for a high precision task.

In some embodiments, a precision level (PL) of the task (i.e., high or low precision level) may dictate acceptable Log VA (element 310) values to be realistically fulfilled. As illustrated in FIG. 4 (collectively, FIGS. 4A-C), some embodiments analyze the posture predicted by the inverse kinematics (IK) engine while using the vision constraint and compare this posture to the one obtained without the vision constraint. As illustrated in FIGS. 4A-C, a task may include positioning a DHM (e.g., virtual manikin, or manikin 206) with the aforementioned IK engine while simulating a drilling task. According to some embodiments, the method 1000 employs high precision level (HPL) values (FIG. 4C) and low precision level (LPL) values (FIG. 4B) for use with an IK algorithm for the manikin 206, assuming perfect vision (Log MAR=0). This allows an assessment of the influence of the PL on the manikin's "head-target" distance 408 during a drilling task. For the drilling task illustrated in FIGS. 4A-C, the manikin 206 may use a drill 418 to drill a hole 416 with a drill jig 406.

The drill 418 may be in the manikin's left hand 412 and aligned with the hole of a guiding jig 406, held in the manikin's right hand 414. The vision target may be the jig hole 416 (target object size=1.5 mm) and its facet normal (S) may be parallel to the hole axis. Three cases are illustrated in FIGS. 4A-C, respectively. First, no vision constraint is applied in FIG. 4A. Next, the vision constraint is applied while using two distinct PLs: a high PL (HPL) in FIG. 4C and low PL (LPL) value in FIG. 4B.

Acceptable visual spaces 410 that result from the application of the HPL and LPL are also computed. According to some embodiments, the interior of these visual spaces 410 may provide a spectrum of solutions that allow the Log VA vision constraint to be fulfilled with the given PL, assuming that the manikin's head 404 directly looks at the target object (drill hole 416 of FIGS. 4A-C). According to some embodiments, the acceptable visual space 410 may be three-dimensional and may provide an indication of an ability of the DHM to perform a task associated with the target object.

According to some embodiments, the acceptable visual space 410 may be generated based upon the Log VA and an additional space known as a forbidden space 420. As illustrated in FIGS. 4B-C, according to some embodiments, the forbidden space 420 may be generated based on a punctum proximum (e.g., near point, as known to those skilled in the art) of the eye of the DHM 206 and/or a corresponding human. According to some embodiments, as illustrated in FIG. 4B, the forbidden space 420 (which may extend approximately or exactly from visual target position 416 to the left hand 412 of the DHM 206) is a half sphere (which may have a diameter and/or average diameter of 250 mm in FIG. 4B, or may have a different value depending on the context). In some embodiments, the sphere center of the forbidden space 420 may be at the visual target position 416.

According to some embodiments, the visual space may be calculated based upon the Log VA. As illustrated in FIGS. 4B-C, in some embodiments, the acceptable visual space 410 may take the form of a sphere and/or an ellipsoid and/or may take a form that is similar to a sphere and/or ellipsoid (which may include, but is not limited to including a half sphere and/or half ellipsoid), but with a forbidden space 420 removed. When the forbidden space 420 is subtracted from the full and/or half ellipsoid and/or full and/or half sphere (not explicitly shown in FIGS. 4B-C), the result is the acceptable visual space 410.

In some embodiments, the HPL value obtained from the experiment of FIG. 4 (FIGS. 4A-4C) is 1.18 (±0.06), while the LPL value is 0.78 (±0.01). These values may be substituted into the PL in Equation 2 in order to predict the drilling task posture, along with using no vision constraint. A similar order of magnitude is obtained for the HT distance 408 with no vision constraint (HT distance 408 of 56.3 cm, in FIG. 4A) and LPL constraint (HT distance 408 of 52.3 cm, in FIG. 4B). However, the HT distance 408 is less than half (HT distance 408 of 23.8 cm, in FIG. 4C) with the HPL constraint. FIGS. 4A-C illustrate that adding a vision constraint that accounts for the PL of the task may influence the HT distance 408 (i.e., norm of HT vector). The acceptable visual spaces 410 for the HPL and LPL tasks are shown as axisymmetric meshes in FIGS. 4B-C.

In another experiment (not shown in the figures), two PL values are assessed in an experiment conducted on a single subject with a perfect vision (Log MAR=0). During the high precision level (HPL) task, the DHM (e.g., manikin or subject) carefully inserts resistors in a breadboard. During the low precision level (LPL) task, the DHM looks at a computer screen in front of him and counts the number of Pac-Man shapes (5 mm width) on a line containing a random pattern of 3 different shapes (square, circle, Pac-Man, or ■, ●, ◖, respectively). As such, according to some embodiments, the head-target (HT) distance may be obtained with a motion analysis system with reflective markers (VICON INC, Oxford, UK), in order to derive the PL values.

Figure 5:
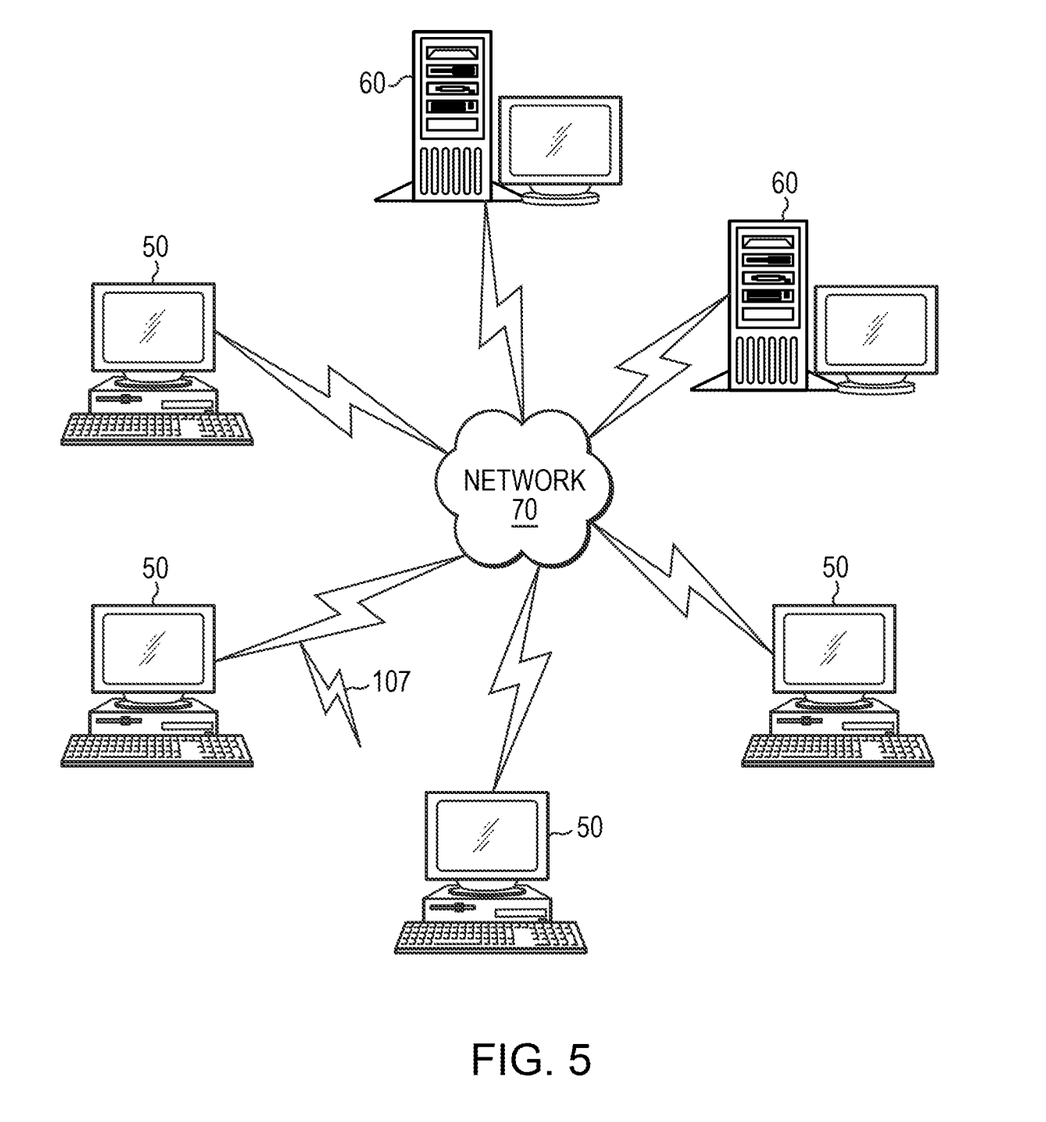
FIG. 5 illustrates a computer network or similar digital processing environment in which embodiments of the present invention may be implemented.

FIG. 5 illustrates a computer network or similar digital processing environment in which embodiments of the present disclosure may be implemented.

Client computer(s)/devices 50 and server computer(s) 60 provide processing, storage, and input/output devices executing application programs and the like. The client computer(s)/devices 50 can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, BLUETOOTH™, etc.) to communicate with one another. Other electronic device/computer network architectures are suitable.

Client computers/devices 50 may be configured with a posturing engine according to some embodiments. Server computers 60 may be configured as the posturing engine which communicates with client devices 50 for accessing the posturing engine. The server computers 60 may be separate server computers or part of cloud network 70. In some embodiments, the server computer 60 (e.g., posturing engine) may communicate with one or more computer applications.

The server computer 60 may include a data engine (as part of or communicatively coupled to the posturing engine), configured to obtain information associated with the original DHM posture. The obtained DHM posture information may include a position of a head of the DHM. The server computer 60 may also include a data engine (as part of or communicatively coupled to the posturing engine), configured to obtain information associated with the target object. The obtained target object information may include a size of the target object and an orientation of the target object. The data engine may be configured to obtain a distance from the head of the DHM to the target object.

The server computer 60 may also include a processing engine (as part of or communicatively coupled to the posturing engine), configured to generate a measure of vision of the DHM of the target object that the DHM is visually targeting, based on one or more parameters which include any of the obtained DHM posture information, the obtained target object information, and the obtained HT distance. The processing engine may be configured to generate, based on the measure of vision, a constraint of vision of the DHM to the target object. The posturing engine may be configured to generate, based on the vision constraint, an updated DHM posture.

The server computer 60 may also include an inverse kinematics engine (as part of or communicatively coupled to the posturing engine). An updated DHM posture may be further generated based on the inverse kinematics engine, the vision constraint, and degrees of freedom of the DHM. The inverse kinematic engine may receive the vision constraint and determines the degrees of freedom of the DHM. The data engine may retrieve information and forward at least a portion of the retrieved information to any of the posturing engine, the processing engine, or inverse kinematics engine.

The client 50 may receive at least a portion of information from the posturing engine, inverse kinematics engine, processing engine, or data engine from the server 60. In some embodiments, the client 50 may include client applications or components executing on the client 50 for monitoring DHM postures and retrieving information associated with DHM postures to facilitate updates to and predictions of DHM postures, and the client 50 may communicate this information to the server (e.g., analysis engine) 60.

Figure 6:
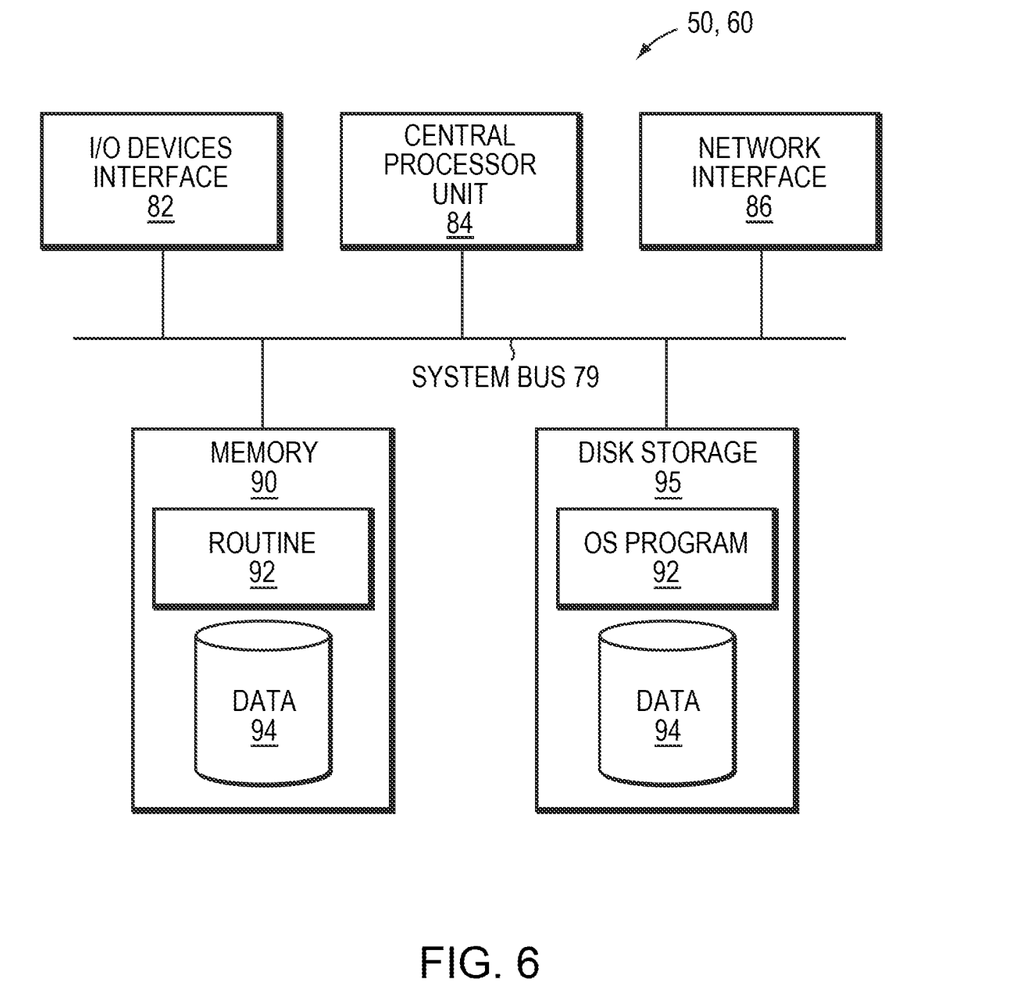
FIG. 6 is a block diagram of the internal structure of a computer in the computer network of FIG. 5.

FIG. 6 is a diagram of an example internal structure of a computer (e.g., client processor/device 50 or server computers 60) in the computer system of FIG. 5. Each computer 50, 60 contains a system bus 79, where a bus is a set of hardware lines used for data transfer among the components of a computer or processing system. The system bus 79 is essentially a shared conduit that connects different elements of a computer system (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, speakers, etc.) to the computer 50, 60. A network interface 86 allows the computer to connect to various other devices attached to a network (e.g., network 70 of FIG. 5). Memory 90 provides volatile storage for computer software instructions 92 and data 94 used to implement an embodiment of the present disclosure (e.g., any of the inverse kinematics engine, data engine, processing engine, and posturing engine elements described herein). Disk storage 95 provides non-volatile storage for computer software instructions 92 and data 94 used to implement an embodiment of the present disclosure. Note, data 94 may be the same between a client 50 and server 60, however, the type of computer software instructions 92 may differ between a client 50 and a server 60. A central processor unit 84 is also attached to the system bus 79 and provides for the execution of computer instructions. In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 may be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 (shown in FIG. 5) embodied on a propagated signal on a propagation medium (e.g., a radio wave, an infrared wave, a laser wave, a sound wave, or an electrical wave propagated over a global network such as the Internet, or other network(s)).

Embodiments or aspects thereof may be implemented in the form of hardware (including but not limited to hardware circuitry), firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

At least one advantage of embodiments that include Log VA, over the existing approaches of Log MAR and sight angle, is that the Log VA allows adaptation of the head-target (HT) distance and orientation simultaneously in order to respect the predefined task precision level (PL) depending on the target object dimensions. According to some embodiments, if the user modifies the target object under focus or the precision level, a new Log VA may be computed and the DHM body posture may be automatically re-adjusted by the inverse kinematics (IK) solver.

Another advantage of some embodiments is that they are more likely to provide probable (realistic) digital manikin posture with minimal to no user interaction. Some embodiments may be used in conjunction with algorithms to provide three-dimensional (3D) virtual ergonomics solutions. As such, some embodiments are particularly beneficial because virtual ergonomics users may spend too much time and energy posturing the DHM, resulting unfortunately in improbable (unrealistic) posture, which may be corrected and/or at least partially resolved by some embodiments.

Some embodiments may transform the behavior and/or data of one or more DHMs by updating the DHMs based on above-mentioned operations. Some embodiments may transform the behavior and/or data of one or more digital human models (DHMs) to provide one or more updated DHMs that are modified based on the vision constraint, which may be transformed based on the vision measure, which may be transformed based on one or more parameters which may include the obtained DHM posture information, the obtained target object information, and the obtained head-target (HT) distance.

Some embodiments may provide functional improvements by improving accuracy of a computer simulation of a posture of a digital human model (DHM) relative to a target object. Some embodiments also may provide functional improvements to the quality of computers, computer applications, computer program functionality, and/or computer code by providing probable (realistic) digital manikin posture with minimal to no user interaction.

Some embodiments solve a technical problem (thereby providing a technical effect) by improving accuracy of a computer simulation of a posture of a digital human model (DHM) relative to a target object. Some embodiments solve a technical problem (thereby providing a technical effect) by providing probable (realistic) digital manikin posture with minimal to no user interaction.

Further, hardware, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for improving accuracy of a computer simulation of an original posture of a digital human model (DHM) relative to a target object in a CAD system, comprising:

having a given DHM posture, obtaining information associated with the given DHM posture in the CAD system, the obtained DHM posture information including a position of a head of the DHM;

obtaining information associated with the target object in the CAD system, the obtained target object information including a size of the target object and an orientation of the target object;

obtaining a distance from the head of the DHM to the target object, the CAD system automating obtaining the DHM posture information, obtaining the target object information, and obtaining the head-target distance;

generating a measure of vision of the DHM of the target object that the DHM is visually targeting, based on one or more parameters which include the obtained DHM posture information, the obtained target object information, and the obtained head-target (HT) distance, said generating the measure of vision being automatically performed by the CAD system, and the generated measure of vision being associated with the size of the target object and the orientation of the target object from the obtained target object information, the measure of vision being a function of (a) a head to target object vector $\overrightarrow{HT}$, (b) a target object length b, and (c) an object facet normal vector $\hat{S}$;

generating, by the CAD system, a vision constraint that simultaneously accounts for (i) the generated measure of vision including the size of the target object and the orientation of the target object, and (ii) a precision level that represents a level of precision required for the DHM to perform a task associated with the target object;

responsively generating corrections to the given DHM posture resulting in an updated DHM posture, said generating corrections being based on the generated vision constraint including the CAD system employing a non-linear solver that verifies whether the generated vision constraint is fulfilled with respect to one or more degrees of freedom (DOF) of the DHM, and upon successful verification by the solver and the CAD system, assigning the one or more degrees of freedom (DOF) to the DHM, the updated DHM posture being a function of degrees of freedom of the DHM; and using the resulting updated DHM posture and the generated vision constraint, by the CAD system, improving an accuracy of a simulation of a posture of a human represented by the DHM in a modeled environment of the CAD system, wherein the CAD system uses the resulting updated DHM posture and the generated vision constraint as input to a simulator and executes the simulator producing the simulation of the posture of the human represented by the DHM in the modeled environment;

wherein the size of the target object includes a size of a facet of the target object and the orientation of the target object includes an orientation of the facet of the target object, the facet comprising a surface of at least one of a plane and a line associated with the target object, the target object being comprised of a plurality of facets.

2. The method of claim 1, wherein the one or more parameters include an angle between a normal to a surface of a facet of the target object and a vector representation having a magnitude of the obtained HT distance having a length and a direction from the head of the DHM to the target object.

3. The method of claim 1, wherein the orientation of the target object includes a vector which is normal to the surface of the facet of the target object.

4. The method of claim 1, wherein the vision constraint represents at least one of a measure of closeness of the DHM to the target object and an ability of the DHM to perform a task associated with the target object, and the corrections to the given DHM posture are generated based on at least one of the measure of closeness of the DHM to the target object and the ability of the DHM to perform the task associated with the target object.

5. The method of claim 1, wherein the vision constraint is generated based on a logarithm of the measure of vision.

6. The method of claim 1, wherein the updated DHM posture provides an increased ability of the DHM to perform a task associated with the target object as compared with an ability of the DHM to perform the task associated with the target object using the given DHM posture in the CAD system.

7. The method of claim 1, further comprising generating a three-dimensional visual space that provides an indication of an ability of the DHM to perform a task associated with the target object.

8. The method of claim 1, wherein the corrections to the given DHM posture resulting in the updated DHM posture are further generated based on an inverse kinematics engine, the vision constraint, and degrees of freedom of the DHM, and the inverse kinematic engine receives the vision constraint and determines the degrees of freedom of the DHM.

9. The method of claim 1, wherein the obtained HT distance is obtained based on measurement of the head of the DHM and the target object from reflective markers.

10. The method of claim 1, wherein the facet comprises a flat face of the target object.

11. The method of claim 1, wherein the vision constraint is a non-linear vision constraint generated based on a non-linear constraint computation.

12. The method of claim 1, wherein the CAD system further employs the non-linear solver to verify that the generated vision constraint is fulfilled based on one or more partial derivatives of the vision constraint.

13. A computer system for improving accuracy of a computer simulation of a posture of a digital human model (DHM) relative to a target object in a CAD system, comprising:

a processor; and a memory with computer code instructions stored thereon, the memory operatively coupled to the processor such that, when executed by the processor, the computer code instructions cause the computer system to implement:

a data engine configured to obtain information associated with the given DHM posture in the CAD system, the obtained DHM posture information including a position of a head of the DHM;

the data engine configured to obtain information associated with the target object in the CAD system, the obtained target object information including a size of the target object and an orientation of the target object;

the data engine configured to obtain a distance from the head of the DHM to the target object;

a processing engine configured to generate a measure of vision of the DHM of the target object that the DHM is visually targeting, based on one or more parameters which include the obtained DHM posture information, the obtained target object information, and the obtained head-target (HT) distance, the generated measure of vision being associated with the size of the target object and the orientation of the target object from the obtained target object information, the measure of vision being a function of (a) a head to target object vector $\overrightarrow{HT}$, (b) a target object length b, and (c) an object facet normal vector $\hat{S}$;

the processing engine configured to generate a vision constraint that simultaneously accounts for (i) the generated measure of vision including the size of the target object and the orientation of the target object, and, (ii) a precision level that represents a level of precision required for the DHM to perform a task associated with the target object;

a posturing engine configured to generate corrections to the given DHM posture resulting in an updated DHM posture, the posturing engine generating said corrections based on the generated vision constraint, the posturing engine employs a non-linear solver that verifies whether the vision constraint is fulfilled with respect to one or more degrees of freedom (DOF) of the DHM, and in response the posturing engine assigns one or more degrees of freedom (DOF) to the DHM, the updated DHM posture being a function of degrees of freedom of the DHM;

the posturing engine further configured to employ the resulting updated DHM posture and the generated vision constraint in the CAD system, to improve an accuracy of a simulation of a posture of a human represented by the DHM in a modeled environment of the CAD system, wherein the CAD system uses the resulting updated DHM posture and the generated vision constraint as input to a simulator and executes the simulator producing the simulation of the posture of the human represented by the DHM in the modeled environment; and wherein the size of the target object includes a size of a facet of the target object and the orientation of the target object includes an orientation of the facet of the target object, the facet comprising a surface of at least one of a plane and a line associated with the target object, the target object being comprised of a plurality of facets.

14. The system of claim 13, wherein the orientation of the target object includes a vector which is normal to the surface of the facet of the target object.

15. The system of claim 13, wherein the one or more parameters include an angle between a normal to a surface of a facet of the target object and a vector representation having a magnitude of the obtained HT distance having a length and a direction from the head of the DHM to the target object.

16. The system of claim 13, wherein the processing engine is configured to represent the vision constraint as being at least one of a measure of closeness of the DHM to the target object and an ability of the DHM to perform a task associated with the target object, and the posturing engine is further configured to generate the corrections to the given DHM posture based on the at least one of the measure of closeness of the DHM to the target object and the ability of the DHM to perform the task associated with the target object.

17. The system of claim 13, wherein the processing engine is further configured to generate the vision constraint based on a logarithm of the measure of vision.

18. The system of claim 13, wherein the posturing engine is further configured to provide the updated DHM posture including an increased ability of the DHM to perform a task associated with the target object as compared with an ability of the DHM to perform the task associated with the target object using the original DHM posture in the CAD system.

19. The system of claim 13, wherein the posturing engine is further configured to generate a three-dimensional visual space that provides an indication of an ability of the DHM to perform a task associated with the target object.

20. A non-transitory computer readable medium having stored thereon a sequence of instructions which, when loaded and executed by a processor of a CAD system, causes the CAD system to:

obtain information associated with a given digital human model (DHM) posture in the CAD system, the obtained DHM posture information including a position of a head of the DHM;

obtain information associated with the target object in the CAD system, the obtained target object information including a size of the target object and an orientation of the target object in the CAD system;

obtain a distance from the head of the DHM to the target object;

generate a measure of vision of the DHM of the target object that the DHM is visually targeting, based on one or more parameters which include the obtained DHM posture information, the obtained target object information, and the obtained head-target (HT) distance, the generated measure of vision being associated with the size of the target object and the orientation of the target object from the obtained target object information, the measure of vision being a function of (a) a head to target object vector $\overrightarrow{HT}$, (b) a target object length b, and (c) an object facet normal vector $\hat{S}$;

generate a vision constraint that simultaneously accounts for (i) the size of the target object and the orientation of the target object as associated with the generated measure of vision and (ii) a precision level that represents a level of precision required for the DHM to perform a task associated with the target object;

generate corrections to the given DHM resulting in an updated DHM posture based on the generated vision constraint, including the CAD system employing a non-linear solver that verifies whether the vision constraint is fulfilled with respect to one or more degrees of freedom (DOF) of the DHM, and the CAD system responsively assigning the one or more degrees of freedom (DOF) to the DHM, the updated DHM posture being a function of degrees of freedom of the DHM;

use the resulting updated DHM posture, and the generated vision constraint, to improve an accuracy of a simulation of a posture of a human represented by the DHM in a modeled environment, wherein the CAD system uses the resulting updated DHM posture and the generated vision constraint as input to a simulator and executes the simulator producing the simulation of the posture of the human represented by the DHM in the modeled environment; and wherein the size of the target object includes a size of the facet of the target object and the orientation of the target object includes an orientation of the facet of the target object, the facet comprising a surface of at least one of a plane and a line associated with the target object, the target object being comprised of a plurality of facets.

* * * * *